United States Patent
Kuroda (10) Patent No.: US 7,157,313 B2
(45) Date of Patent: Jan. 2, 2007

(54) EPOXY RESIN COMPOSITION AND SEMICONDUCTOR DEVICE USING THEREOF

(75) Inventor: Hirofumi Kuroda, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 509 days.

(21) Appl. No.: 10/758,487

(22) Filed: Jan. 15, 2004

(65) Prior Publication Data

US 2004/0232532 A1 Nov. 25, 2004

(30) Foreign Application Priority Data

Jan. 17, 2003 (JP) .............................. 2003-010387

(51) Int. Cl.
*H01L 21/58* (2006.01)
*B32B 27/38* (2006.01)
*C08L 63/00* (2006.01)

(52) U.S. Cl. ...................... 438/127; 428/413; 428/414; 438/118; 438/119; 523/400; 523/440; 525/523; 525/529

(58) Field of Classification Search ...................... None
See application file for complete search history.

(56) References Cited

U.S. PATENT DOCUMENTS

| | | | |
|---|---|---|---|
| 6,284,818 B1 * | 9/2001 | Kawata et al. ............... | 523/451 |
| 6,376,101 B1 * | 4/2002 | Ota ............................. | 428/620 |
| 6,733,901 B1 * | 5/2004 | Takasaki et al. ............. | 428/620 |
| 2003/0201548 A1 * | 10/2003 | Ikezawa et al. .............. | 257/793 |
| 2005/0222300 A1 * | 10/2005 | Ikezawa et al. .............. | 523/457 |
| 2006/0014873 A1 * | 1/2006 | Ikezawa et al. .............. | 524/413 |

FOREIGN PATENT DOCUMENTS

| | | |
|---|---|---|
| JP | 05-131486 | 5/1993 |
| JP | 08-073703 | 3/1996 |
| JP | 09-143345 | 6/1997 |
| JP | 10-007888 | * 1/1998 |
| JP | 10-324791 | 12/1998 |
| JP | 11-152393 | 6/1999 |
| JP | 2000-017150 | 1/2000 |
| JP | 2001-172473 | 6/2001 |
| JP | 2001-247748 | 9/2001 |
| JP | 2001-329051 | 11/2001 |
| JP | 2002-284853 | 10/2002 |
| JP | 2002-284969 | 10/2002 |
| JP | 2002-356538 | 12/2002 |
| JP | 2003-064159 | 3/2003 |
| JP | 2003064239 | 3/2003 |
| JP | 2003-128750 | 5/2003 |
| JP | 2003212957 | 7/2003 |

OTHER PUBLICATIONS

Machine translation of JP 10-007888, provided by the JPO website.*

* cited by examiner

*Primary Examiner*—Michael J. Feely
(74) *Attorney, Agent, or Firm*—Smith, Gambrell & Russell, LLP (57) ABSTRACT

The present invention provides an epoxy resin composition for packaging a semiconductor device, characterized in having improved mold releasability during a molding process, continuous-moldability and improved solder resistance. According to the present invention, there is provided an epoxy resin composition for packaging the semiconductor element, obtained by formulating: (A) an epoxy resin; (B) a phenolic resin; (C) a curing accelerator; (D) an inorganic filler; and (E) an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm, wherein at least one of (A) epoxy resin and (B) phenolic resin is a novolac structured resin having biphenylene structure, and wherein content of (E) oxidized polyethylene wax in epoxy resin composition is within a range of from 0.01 to 1 % wt.

21 Claims, 3 Drawing Sheets

EPOXY RESIN COMPOSITION AND SEMICONDUCTOR DEVICE USING THEREOF

This application is based on and claims priority to Japanese Patent Application No. 2003-10,387 filed Jan. 17, 2003, the content of which is incorporated hereinto by reference.

FIELD OF THE INVENTION

The present invention relates to an epoxy resin composition having improved mold releasability and improved continuous moldability and a semiconductor device utilizing thereof having improved solder resistance.

DESCRIPTION OF THE RELATED ART

In recent years, the levels of the integration and the surface mountability of semiconductor elements are increasing among a situation where there are growing needs for achieving faster operation and lighter, thinner and more compact bodies of electronic equipments. Based on this situation, it is the current situation that the requirements for epoxy resin composition employed for packaging semiconductor elements are growingly increased. In particular in the efforts for obtaining thinner semiconductor devices, stress may be generated due to an incomplete mold releasing occurred between metal mold and cured resin of an epoxy composition, and the stress may lead to problems, in which cracks are generated in semiconductor elements themselves within the semiconductor devices or adhesiveness at the interface between the cured resin and the semiconductor elements is decreased. Further, under the situation of the transition in the type of solder where lead-containing solder is replaced to lead-free solder, for the correspondence to an environmental problem, process temperature required for the solder processing increases, and thus problems of the solder resistance required for resisting to a stress explosively caused by a vaporization of moisture contained within the semiconductor device become more serious than the conventional technology.

Accordingly, various proposals for improving the solder resistance are made. For example, having biphenylene unit in main chain strecture, phenol aralkyl type of phenolic resin or epoxy resin has been proposed (JP-A-H09-143,345). Since those resins contain much amount of hydrophobic chemical structures in a molecule, the cured product of an epoxy resin composition containing the resin is characterized in that the product has lower moisture absorption, and is also characterized in that the product has lower elastic modulus at an elevated temperature region higher than its glass transition temperature since the cured product of an epoxy resin composition has lower cross-linkage density. Thus, the semiconductor device employing such epoxy resin composition is capable of decreasing the explosive stress that, otherwise, is caused by the vaporization of water during the solder processing. In addition, since the cured product of an epoxy resin composition has lower elastic modulus at an elevated temperature during the heating thereof, the thermal stress caused during the solder processing can be reduced. Therefore, the semiconductor device eventually is characterized in having better solder resistance. However, since the resin having the structure represented by general formula (1) (mentioned later) contains much amount of hydrophobic chemical structures in the molecule, the composition containing the resin has poor adhesiveness with metal materials such as lead frame or the like. In addition, lower density of functional group contained in a molecular of the resin leads to incomplete cure, causing incomplete releasing from the mold, and therefore unwanted stress is generated and exerted on the semiconductor device during the demolding process, causing further decrease of the adhesiveness with the metal materials. In order to improve the mold releasability, conventionally used release agent such as carnauba or the like wax may be added to the composition. However, the addition of the conventional release agent may not sufficiently improve the mold releasability, and instead, the adhesiveness with the metal member is further deteriorated, causing another problem of reducing the solder resistance.

Proposed techniques for improving the mold releasability of the epoxy resin composition may include a use of a biphenyl epoxy resin, which is an epoxy resin having lower resin viscosity so that higher loading of inorganic filler can be achieved, or an epoxy resin composition containing a release agent, which involves improved mold releasability (for example, see JP-A-H07-37,041 (1995), JP-A-2003-128, 750). However, since the higher loading of the inorganic filler causes considerable increase of the elastic modulus of the composition, in comparison with the case of the epoxy resin composition containing the resin having the structure represented by general formula (1) as one of two components for forming the epoxy resin, and therefore it is concerned that the solder resistance thereof may be reduced.

Another epoxy resin containing another type of release agent, which is similar to those disclosed in JP-A-H07-37, 041 but has higher-acid value region that provides better solubility with the resin, is proposed (for example, see JP-A-H11-152,393 (1999)).

SUMMARY OF THE INVENTION

It has been found in various evaluations conducted by the present inventors that a balance or an adjustment of the solubility of the resin component with the release agent contained in the epoxy resin composition is critical, and more specifically there is an optimum region that provides good solubility between the resin component and the releasing agent contained in the epoxy resin composition without any excess and deficiency. Thus, it is considered that sufficient mold releasability can not be achieved since the technique proposed in JP-A-H11-152,393 (1999) provides too much better solubility of the resin component with the releasing agent contained in the epoxy resin composition.

According to the present invention, there is provided an epoxy resin composition for packaging a semiconductor element, obtained by formulating:

(A) phenol aralkyl type of epoxy resin having a biphenylene unit in the main chain;
(B) a phenolic resin;
(C) a curing accelerator;
(D) an inorganic filler; and
(E) an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

Further, according to the present invention, there is provided an epoxy resin composition for packaging a semiconductor element, obtained by formulating:

(A) an epoxy resin;
(B) a phenol aralkyl type of phenolic resin having a biphenylene unit in the main chain;

(C) a curing accelerator;

(D) an inorganic filler; and (E) an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

Both of the said (A) epoxy resin and said (B) phenolic resin may be a phenol aralkyl type resin having a biphenylene unit in the main chain.

Further, according to the present invention, there is provided a semiconductor device, which is formed by employing said epoxy resin to package a semiconductor element included therein.

DETAIL DESCRIPTION OF THE INVENTION

The epoxy resin (A) may have the structure represented by general formula (1a)

(1a)

(wherein, Rs, each of which may be same or different, represents a hydrogen atom or functional group selected from alkyl groups having 1 carbon to 4 carbons; X represents glycidyl ether group; and n represents a positive number more than or equal to 1.)

The phenolic resin (B) may have a structure represented by general formula (1b):

(1b)

(wherein, Rs, each of which may be same or different, represents a hydrogen atom or functional group selected from alkyl groups having 1 carbon to 4 carbons; X represents hydroxyl group; and n represents a positive number more than or equal to 1.)

The epoxy resin composition of the present invention can contain each component as follows:

(A): 1 to 40% weight.

(B): 1 to 40% weight.

(C): 0.001 to 5% weight.

(D): 40 to 97% weight.

Since the phenol aralkyl type of epoxy resin having a biphenylene unit in the main chain, especially, the epoxy resin having the structure represented by general formula (1a) employed in the present invention (wherein X represents glycidyl ether group) contains much amount of hydrophobic chemical structures in the resin structure, the cured product of an epoxy resin composition containing the epoxy resin is characterized in having lower moisture absorption, and since the resin has lower cross-linkage density, the cured product is characterized in having lower elastic modulus at a temperature within an elevated temperature region higher than its glass transition temperature. Since the cured product of the epoxy resin composition containing thereof has lower moisture absorption, the product is capable of reducing the explosive stress that is caused by the vaporization of moisture during the solder processing. In addition, since the cured product of epoxy resin composition has lower elastic modulus at elevated temperature during the heating thereof, the thermal stress caused during the solder processing can be reduced. Therefore, the semiconductor device eventually is characterized in having better solder resistance.

The epoxy resin containing the resin having the structure represented by general formula (1a) (wherein X represents glycidyl ether group) may be employed together with other type of epoxy resin provided that the addition of other type of epoxy resin is not harmful to the properties of the epoxy resin composition containing thereof. The illustrative examples of the other type of epoxy resins may include, for example: phenol novolac type epoxy resin; cresol novolac type epoxy resin; biphenyl type epoxy resin; bisphenol type epoxy resin; stilbene type epoxy resin; triphenolmethane type epoxy resin; phenol aralkyl (including phenylene unit) type epoxy resin; naphthol type epoxy resin; alkyl-modified triphenolmethane type epoxy resin; triazine nuclear containing epoxy resin; dicyclopentadiene-modified phenol type epoxy resin or the like, and one of these resins alone, or a combination thereof may be employed. An example of the epoxy resin having the structure represented by general formula (1a) (wherein X represents glycidyl ether group) may be, and is not limited to, a resin shown in formula (2).

(2)

(wherein n represents an average value and a positive number of from 1 to 3.)

Since the phenol aralkyl type of phenolic resin having a biphenylene unit in the main chain, especially, the phenolic resin having the structure represented by general formula (1b) employed in the present invention (wherein X represents hydroxyl group) contains much amount of hydrophobic chemical structures in the resin structure, the cured product of an epoxy resin composition containing the phenolic resin is characterized in having lower moisture absorption, and since the resin has lower cross-linkage density, the cured product is characterized in having lower elastic modulus at a temperature within an elevated temperature region higher than its glass transition temperature. Since the cured resin product of the epoxy resin composition containing thereof exhibits lower moisture absorption, the product is capable of reducing the explosive stress that is caused by the vaporization of moisture during the solder processing. In addition, since the epoxy resin composition has lower elastic modulus at elevated temperature during the heating thereof, the thermal stress caused during the solder processing can be reduced. Therefore, the semiconductor device eventually is characterized in having better solder resistance.

The phenolic resin having the structure represented by general formula (1b) (wherein X represents hydroxyl group) may be employed together with other type of phenolic resin provided that the addition of other type of phenolic resin is not harmful to the properties of the epoxy resin composition containing thereof. The illustrative examples of the other type of phenolic resins may include, for example: phenol novolac resin; cresol novolac resin; triphenolmethane resin; terpene-modified phenolic resin; dicyclopentadiene-modifiedphenolic resin; phenol aralkyl (including phenylene structure) resin; naphtholaralkyl resin or the like, and one of these resins alone, or a combination thereof may be employed. An example of the phenolic resin having the structure represented by general formula (1b) (wherein X represents hydroxyl group) may be, and is not limited to, a resin shown in formula (3).

(3)

(wherein n represents an average value and a positive number of from 1 to 3.)

The equivalent ratio between epoxy group contained in the whole epoxy resin and phenolic hydroxyl group contained in the whole phenolic resin may preferably be within a range of from 0.5 to 2, and more preferably within a range of from 0.7 to 1.5. The equivalent ratio within the range provides good moisture resistance and curing property.

The curing accelerator employed in the present invention represents a compound being capable of functioning a catalyst for the cross-linking reaction between epoxy resin and phenolic resin, and the illustrative examples may be, and not limited to: amine compounds such as tributyl amine, 1,8-diazabicyclo (5,4,0)undecene-7 or the like; organophosphorus compounds such as triphenylphosphine, tetraphenylphosphonium tetraphenylborate or the like; imidazole compounds such as 2-methylimidazole or the like. One of these curing accelerator alone, or a combination thereof may be employed.

The illustrative example of inorganic filler employed in the present invention may be: fused silica; crystallized silica; alumina; silicon nitride; aluminum nitride or the like. When the particularly large amount of the inorganic filler is intended to be loaded, the fused silica is generally employed. Although either of the crushed fused silica and the spherical fused silica may be employed, the spherical fused silica is preferably employed for the purpose of achieving higher loading of the fused silica while inhibiting the increase of the viscosity of the epoxy resin composition due to the higher filler loading. Further, the spherical fused silica is preferably designed to have broader particle size distribution for the purpose of achieving higher loading of the spherical fused silica therein.

The oxidized polyethylene wax employed in the present invention generally contains polar group formed of carboxylic group or the like and non-polar group formed of long carbon chain, and thus the polar group is oriented toward the side of the cured resin composition and conversely the non-polar group is oriented toward the metal mold side, thereby functioning as the release agent. The drop point of the oxidized polyethylene wax employed in the present invention is within a range of from 60 to 140 degree C., and may preferably be within a range of from 100 to 130 degree C. The drop point of lower than the lower limitation of the ranges presented above may provide insufficient thermal stability, so that the thermal stain of the oxidized polyethylene wax occurs during the continuous molding processes, thereby deteriorating the mold releasability thereof and adversely affecting the continuous moldability. The drop point of higher than the upper limitation of the ranges presented above may provide a condition of insufficient melting of the oxidized polyethylene wax during the curing process of the epoxy resin composition, so that the state of dispersion of the oxidized polyethylene wax within the composition decreases, thereby causing maldistribution of the oxidized polyethylene wax onto the surface of the cured product to provide stains on the metal mold surface and present bad appearance of the cured resin product. The acid value thereof is within a range of from 10 to 100 (mg KOH/g), and may preferably be within a range of from 15 to 40 (mg KOH/g). The acid value thereof is influential to the solubility with the cured resin product, and the acid value of lower than the lower limitation of the ranges presented above may cause a phase separation of the oxidized polyethylene wax, thereby causing stains on the metal mold surface and bad appearance of the cured resin product. The acid value of higher than the upper limitation of the ranges presented above may provide too much better solubility with the epoxy resin matrix, causing substantially no ooze of the release agent onto the surface of the cured resin, thereby being impossible to ensure achieving the sufficient mold releasability. The number average molecular weight thereof is within a range of from 500 to 20,000, and may preferably be within a range of from 1,000 to 15,000. The number average molecular weight lower than the lower limitation of the ranges presented above may provide higher affinity between the oxidized polyethylene wax and the resin matrix, thereby causing insufficient mold releasability. The number average molecular weight higher than the upper limitation of the ranges presented above may provide the phase separation of the oxidized polyethylene wax, thereby causing stains on the metal mold surface and bad appearance of the cured resin product. The mean particle size thereof is within a range of from 5 to 100 μm, and may preferably be within a range of from 10 to 50 μm. The mean particle size lower than the lower limitation of the ranges presented above may provide too much better solubility with the epoxy resin matrix, causing substantially no ooze of the release agent onto the surface of the cured resin, thereby being impossible to ensure achieving the sufficient mold releasability. The mean particle size higher than the upper limitation of the ranges presented above may provide segregation of the oxidized polyethylene wax to provide stains on the metal mold surface and present bad appearance of the cured resin product. The content of oxidized polyethylene wax in the epoxy resin composition is within a range of from 0.01 to 1% wt, and may preferably be within a range of from 0.03 to 0.50% wt. The value lower than the lower limitation of the ranges presented above may provide insufficient mold releasing, and the value higher than the upper limitation of the ranges presented above may deteriorate the adhesiveness with the lead frame material, thereby causing the peeling off from the material during the solder processing. Further, stains on the metal mold surface and bad appearance of the cured resin product are caused.

Other release agent may be employed together therewith provided that the addition of other type of release agent is not harmful to the properties of the oxidized polyethylene wax. The illustrative examples of the other type of release agent may include, for example: natural waxes such as carnauba wax or the like; metallic salts of higher fatty acids such as zinc stearate or the like.

The epoxy resin composition according to the present invention consists essentially of the aforementioned components (A) to (E), and various types of other additives of: coupling agents; fire retardant agents such as brominated epoxy resin, antimony trioxide, phosphate compounds or the like; coloring agents such as carbon black or the like; low stress agent such as silicone oil, silicone rubber, synthetic rubber or the like; or a antioxidants, may optionally be added therein if required.

The epoxy resin composition according to the present invention may be obtained by: mixing the aforementioned components (A) to (E) and other additives by using a mixer to obtain a mixture; thereafter heating and kneading the mixture by using a heating kneader, heating roll or extruder to obtain a kneaded compound; and subsequently cooling and pulverizing the kneaded compound to obtain the finished product.

The epoxy resin composition according to the present invention may be cured and molded by a conventional method such as transfer molding, compression molding, injection molding or the like to package the electronic parts such as semiconductor elements or the like, thereby obtaining the semiconductor device.

Figure 3:
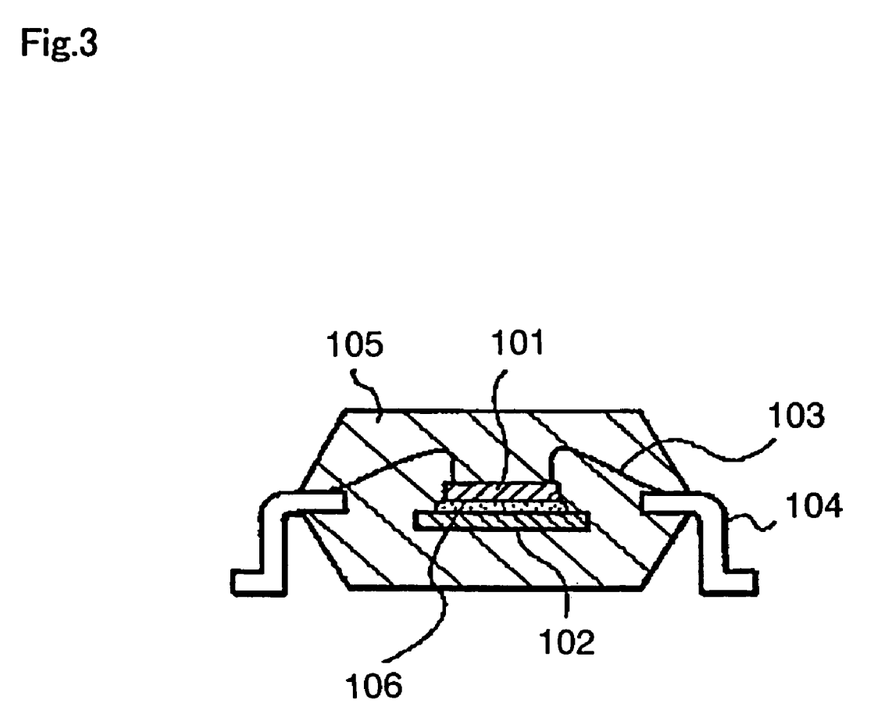
FIG. 3 is a schematic cross sectional view of a semiconductor device, showing a package of the epoxy resin composition encapsulating a semiconductor element.

FIG. 3 is a schematic cross sectional view of a structure of an illustrative example of a semiconductor device, which employs the packaging resin according to the present invention. A semiconductor element 101 is fixed on a die pad 102 via a cured die bonding material 106. Gold wires 103 couple the semiconductor element 101 to lead frames 104. The semiconductor element 101 is packaged with a packaging resin 105. The semiconductor device is obtainable by transfer-molding the resin composition having a composition described above employed as the packaging resin 105.

EXAMPLES

Particle size of oxidized polyethylene wax and silica means numerical average value, measured by laser diffraction particle size analyzer (SALD-7000, shimazu corporation).

The present invention will be described in reference to the following Examples. Here, the formulation of the composition will be described by parts by weight.

Example 1

Components of:

An epoxy resin (phenol aralkyl type epoxy resin including biphenylene structure, commercially available from Nippon Kayaku, Tokyo Japan, under the trade name of NC3000P, softening point: 58 degree C., epoxy equivalent: 273) represented by formula (2): 8.80 parts by weight;

(2)

n=2.8(average value)

A phenolic resin (phenol aralkyl resin including phenylene structure, commercially available from Mitsui Chemical, Tokyo Japan, under the trade name of XLC-4L, softening point: 65 degree C., hydroxyl group equivalent: 174) represented by formula (5): 5.40 parts by weight;

(5)

n=3.3(average value)

1,8-diazabicyclo (5,4,0)undecene-7 (hereinafter abbreviated as DBU): 0.20 parts by weight;

Spherical fused silica (mean particle size: 30.0 μm): 85.20 parts by weight;

Carbon Black: 0.30 parts by weight; and

Release agent (I): oxidized polyethylene wax (drop point: 120 degree C., acid value: 20 (mg KOH/g), number average molecular weight: 2,000, mean particle size of 50 μm): 0.10 parts by weight were mixed by using a mixer, and thereafter the mixed compound was kneaded for 20 times by a two-roll mill, surface temperatures of which were 95 degree C. and 25 degree C., and the resultant kneaded compound was cooled and pulverized to obtain the epoxy resin composition. The performances of the obtained epoxy resin composition were evaluated by the following method.

Figure 1:
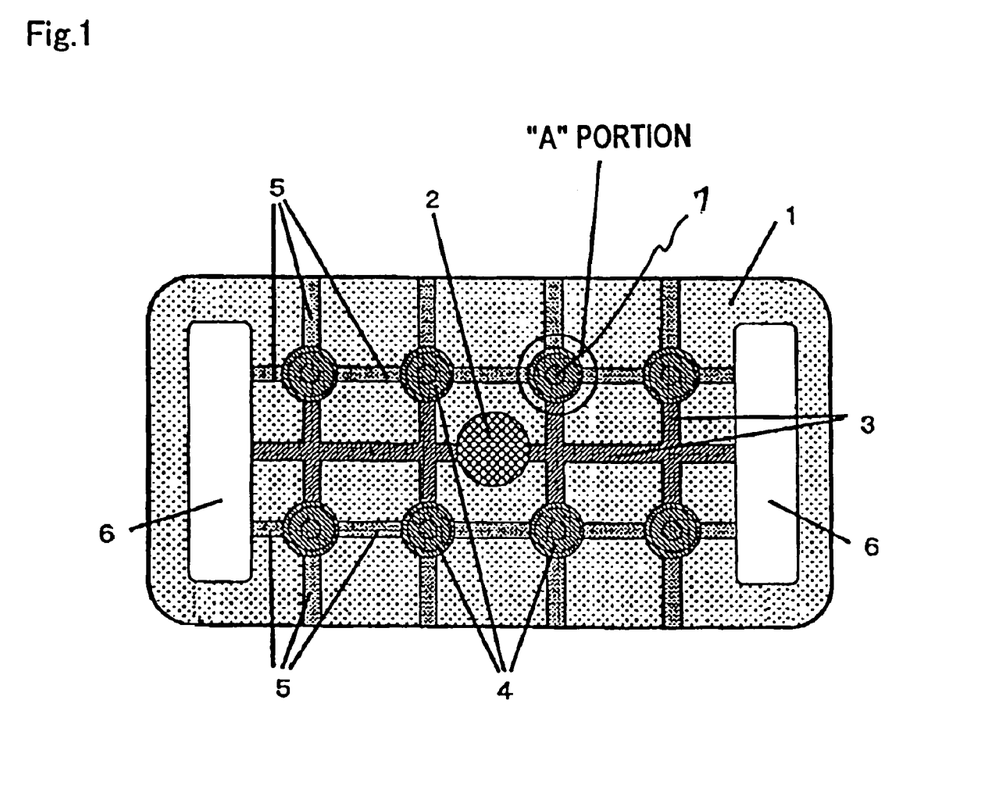
FIG. 1 is a plan view of a center mold of a mold for evaluating the releasing force, showing a state of runners, culls and molded products disposed in the center mold.
Figure 2:
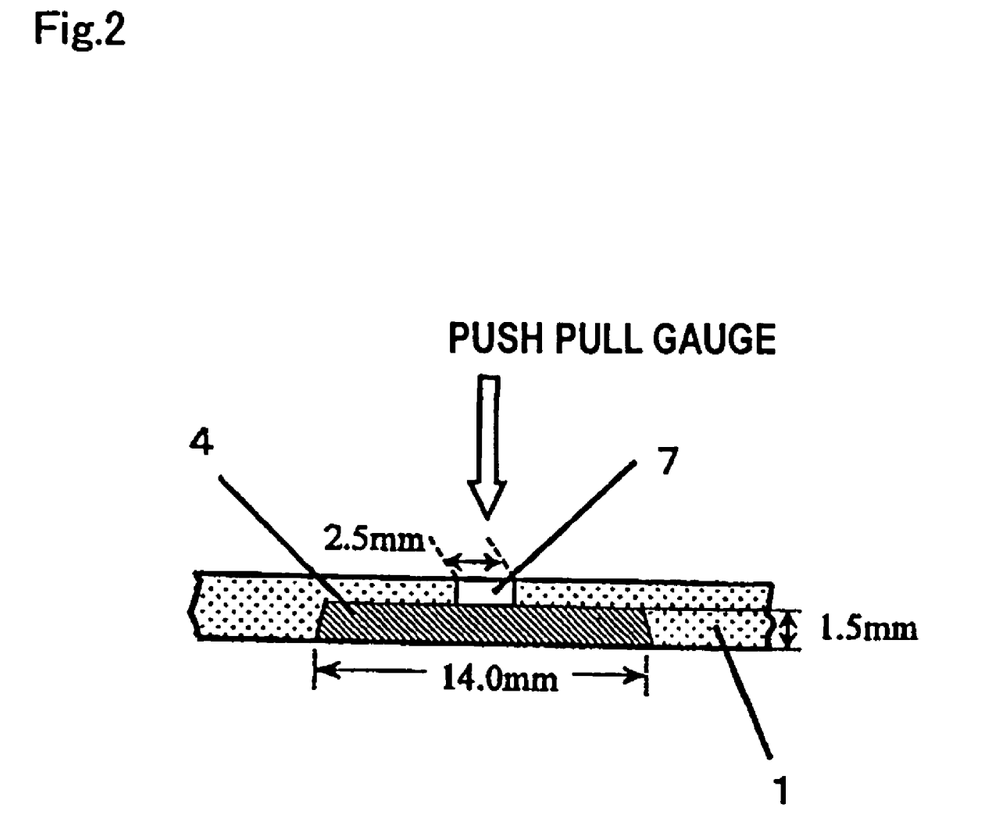
FIG. 2 is an enlarged cross sectional view of the "A" portion shown in FIG. 1.

Property of the conventional oxidized polyethylene wax is as follows:

drop point: 120 to 125 degree C.
acid value: 15 to 19 (mg KOH/g)
number average molecular weight: 750
mean particle size: about 150 μm Evaluation Method (1) Metal Mold for Evaluations (i) A metal mold for evaluating the releasing force comprises an upper mold, a center mold shown in FIG. 1 and a lower mold, and the shape of the molded product, which is adhered to the center mold after the molding process is completed, is: 14.0 mm in diameter and 1.5 mm in height or thickness (transfer molding). In FIG. 1, numeral 1 denotes a center mold, numeral 2 denotes a cull, numeral denotes a runner, numeral 4 denotes a molded product, numeral 5 denotes an air vent, numeral 6 denotes a knob, and numeral 7 denotes a hole for inserting push pull gauge.

(ii) A mold for evaluating the formation of stain on the metal mold surface and the solder resistance is a metal mold for packaging a 100-pin thin quad flat-leaded package (TQFP) semiconductor element, and the package size thereof is: 14 mm×14 mm, and 14 mm thick (transfer molding).

Method for the treatment of the metal mold surface: in order to clean the metal mold surface, a treatment for providing mold releasability to the metal mold was conducted by molding a metal mold-cleaning material such as melamine resin and conditioning material. The molding conditions were: metal mold temperature was 175 degree C., and the injection pressure was 7.3 MPa.

Evaluation of the releasing force: the epoxy resin composition was molded by employing the metal mold that had been processed with the aforementioned treatment for providing mold releasability under the molding condition of: metal mold temperature of 175 degree C., the injection pressure of 6.9 MPa, and the curing time of 2 minutes. 4 molded products arbitrarily selected from the total 8 molded products that were adhered onto the center mold were released in the predetermined order by being pushed via apertures disposed on the upper side of the center mold within 20 seconds from the opening of the mold. The loads required for the demolding by being pushed were measured by pointing push-pull gauges through the apertures disposed in the upper side of the center mold at 1st, 10th, 50th and 100th shots in the continuous molding processes. The obtained four data in each shot were averaged. The unit for presenting the load was [N].

Evaluation of the continuous moldability: the treatment for providing mold releasability was conducted to the metal mold for packaging a 100-pin TQFP semiconductor element, and thereafter 500 packages of the 100-pin TQFPs comprising the lead frames having no semiconductor elements mounted thereon were continuously molded with the epoxy resin composition under the conditions of: metal mold temperature of 175 degree C., and the injection pressure of 7.3 MPa, and the curing time of 1 minute. The degree of stains (particularly, frosting and whitening) appeared on the molded product surface and on the metal mold surface during the continuous moldings were observed. The evaluation results were presented by: "X" for the molded product adhered to the metal mold when demolding; "Δ" for the molded product on which frosting, whitening or greasing were caused; and "O" for the molded product without any problem.

Evaluation for the spiral flow (flowability): The spiral flow of the composition was measured by employing a metal mold for the spiral flow measurement according as EMMII-1-66, under the conditions of: metal mold temperature of 175 degree C., the injection pressure of 6.9 MPa, and the curing time of 2 minutes. The unit for presenting the spiral flow was [cm].

Evaluation of the shore D-hardness: 16-pin small outline package (SOP) (20 mm×6.5 mm, 3.3 mm thick) was molded via the transfer molding under the conditions of: metal mold temperature of 175 degree C., the injection pressure of 7.3 MPa, and the curing time of 2 minutes, and the surface hardness of the molded product at 10 seconds after opening the mold was measured by using the shore D hardness meter.

Evaluation of the adhesiveness at high temperature: a molded product (having a shape of circular cone but apex thereof was cut off, diameter of the cut-off upper surface of 2.5 mm, diameter of lower surface of 3.0 mm, height of 3.0 mm) for measuring the shear adhesiveness was molded on a base material (having length of 30 mm, width of 9 mm and thickness of 150 µm, material of the member was Cu) under the conditions of: metal mold temperature of 175 degree C., the injection pressure of 6.9 MPa, and the curing time of 2 minutes, and further the post cure process was conducted at 175 degree C. for 8 hrs. A shear load meter was used to hold the base member in the shear load meter at 240 degree C. for 1 minute, and a load was laterally exerted to the molded product at a position of 125 µm-high from the lower surface of the molded product at the same temperature to measure the required load by peeling the molded product off from the base member. The unit for presenting the shear load was [N/mm$^2$].

Evaluation of the solder resistance: after the above-mentioned 500 packages for the evaluation of the continuous moldability were molded, the epoxy resin composition was molded to package the 100-pin TQFP (the size of the semiconductor element was 8.0×8.0 mm, the lead frame thereof was made of 42 alloy) under the conditions of: metal mold temperature of 175 degree C., the injection pressure of 7.3 MPa, and the curing time of 1 minute, and the post cure process was conducted at 175 degree C. for 8 hrs, and then the obtained package was left for 168 hrs at 85 degree C. and the relative humidity of 85%, and thereafter the package was immersed in the solder bath of 240 degree C. for 10 seconds. The delaminated area of the cured product of the epoxy resin composition, where the cured epoxy resin composition was delaminated from the surface of the lead frame base material (the island back surface, and tip of the inner lead), was measured by utilizing a scanning accoustic tomograph, and the delaminated ratio was calculated by the formulation:

[delaminated ratio]=((delaminated area)/(semiconductor element surface area)×100):

The number of the sample n=10. The unit for presenting the delaminated ratio is [%].

Examples 2 to 10 and Comparative Examples 1 to 9

Each of the components were blended according to the formulations listed in Table-1 to obtain the epoxy resin composition similarly as in Example 1, and the obtained products were evaluated similarly as in Example 1. The results are shown in Table-1.

Other components employed in Examples and Comparative Examples except Example 1 will be described below.

A phenolic resin (phenol aralkyl resin including biphenylene structure, commercially available from Meiwa Chemical, Japan, under the trade name of MEH7851SS, softening point: 67 degree C., hydroxyl group equivalent: 203) represented by formula (3);

n=2.5(average value)

An epoxy resin (biphenyl type epoxy resin, commercially available from Japan Epoxy Resin, Japan, under the trade name of YX-4000H, melting point: 105 degree C., epoxy equivalent: 191) represented by formula (4);

Release agent(II): oxidized polyethylene wax (drop point: 70 degree C., acid value: 20 (mg KOH/g), number average molecular weight: 750, mean particle size of 50 μm):

Release agent(III): oxidized polyethylene wax (drop point: 120 degree C., acid value: 75 (mg KOH/g), number average molecular weight: 2,000, mean particle size of 50 μm):

Release agent(IV): oxidized polyethylene wax (drop point: 130 degree C., acid value: 20 (mg KOH/g), number average molecular weight: 15,000, mean particle size of 50 μm):

Release agent(V): oxidized polyethylene wax (drop point: 120 degree C., acid value: 20 (mg KOH/g), number average molecular weight: 2,000, mean particle size of 15 μm):

Release agent(VI): oxidized polyethylene wax (drop point: 120 degree C., acid value: 20 (mg KOH/g), number average molecular weight: 2,000, mean particle size of 90 μm):

Release agent (VII): oxidized polyethylene wax (drop point: 50 degree C., acid value: 20 (mg KOH/g), number average molecular weight: 1,000, mean particle size of 50 μm):

Release agent (VIII): oxidized polyethylene wax (drop point: 160 degree C., acid value: 20 (mg KOH/g), number average molecular weight: 4,000, mean particle size of 50 μm):

Release agent(IX): oxidized polyethylene wax (drop point: 120 degree C., acid value: 5 (mg KOH/g), number average molecular weight: 2,000, mean particle size of 50 μm):

Release agent(X): oxidized polyethylene wax (drop point: 120 degree C., acid value: 150 (mg KOH/g), number average molecular weight: 2,000, mean particle size of 50 μm):

Release agent(XI): oxidized polyethylene wax (drop point: 55 degree C., acid value: 20 (mg KOH/g), number average molecular weight: 350, mean particle size of 50 μm):

Release agent(XII): oxidized polyethylene wax (drop point: 150 degree C., acid value: 20 (mg KOH/g), number average molecular weight: 30,000, mean particle size of 50 μm):

Release agent(XIII): oxidized polyethylene wax (drop point: 120 degree C., acid value: 20 (mg KOH/g), number average molecular weight: 3,000, mean particle size of 3 μm): and Release agent(XIV): oxidized polyethylene wax (drop point: 120 degree C., acid value: 20 (mg KOH/g), number average molecular weight: 2,000, mean particle size of 200 μm).

The present invention is directed to a epoxy resin composition containing (1) a resin component having lower moisture absorption and involving lower stress and (2) a specified anti-mold agent, and to a semiconductor device using same, and the present invention provides a semiconductor device having improved mold releasability during a molding process and continuous-moldability, and also have improved adhesiveness with metal materials such as lead frame or the like and improved solder resistance.

Further, it is confirmed that content of (E) oxidized polyethylene wax in epoxy resin composition within a range of from 0.01 to 1% wt gives similar effect in the above execution example.

TABLE 1

| | EXAMPLES | | | | | | | | | |
|---|---|---|---|---|---|---|---|---|---|---|
| | 1 | 2 | 3 | 4 | 5 | 6 | 7 | 8 | 9 | 10 |
| Formulation | | | | | | | | | | |
| Epoxy resin rep. by formula (2) | 8.80 | | 8.16 | 8.16 | 8.16 | 8.16 | 8.16 | 8.16 | 8.19 | 7.93 |
| Phenolic resin rep. by formula (3) | | 7.32 | 6.04 | 6.04 | 6.04 | 6.04 | 6.04 | 6.04 | 6.06 | 5.87 |
| Epoxy resin rep. d by formula (4) | | 6.89 | | | | | | | | |
| Phenolic resin rep. by formula (5) | 5.40 | | | | | | | | | |
| DBU | 0.20 | 0.20 | 0.20 | 0.20 | 0.20 | 0.20 | 0.20 | 0.20 | 0.20 | 0.20 |

TABLE 1-continued

| | | EXAMPLES | | | | | | | | | |
|---|---|---|---|---|---|---|---|---|---|---|---|
| | | 1 | 2 | 3 | 4 | 5 | 6 | 7 | 8 | 9 | 10 |
| Spherical fused silica | | 85.20 | 85.20 | 85.20 | 85.20 | 85.20 | 85.20 | 85.20 | 85.20 | 85.20 | 85.20 |
| Carbon black | | 0.30 | 0.30 | 0.30 | 0.30 | 0.30 | 0.30 | 0.30 | 0.30 | 0.30 | 0.30 |
| Release agent (I) | | 0.10 | 0.10 | 0.10 | | | | | | 0.02 | 0.80 |
| Release agent (II) | | | | | 0.10 | | | | | | |
| Release agent (III) | | | | | | 0.10 | | | | | |
| Release agent (IV) | | | | | | | 0.10 | | | | |
| Release agent (V) | | | | | | | | 0.10 | | | |
| Release agent (VI) | | | | | | | | | 0.10 | | |
| result | | | | | | | | | | | |
| Releasing force (N) | 1st shot | 2.0 | 1.9 | 1.8 | 2.2 | 2.3 | 1.8 | 2.2 | 2.0 | 2.8 | 1.7 |
| | 10th shot | 1.8 | 1.9 | 1.6 | 2.1 | 2.2 | 1.6 | 2.1 | 2.0 | 2.4 | 1.5 |
| | 50th shot | 1.6 | 1.7 | 1.4 | 1.9 | 2.0 | 1.4 | 1.8 | 1.9 | 2.0 | 1.3 |
| | 100th shot | 1.5 | 1.4 | 1.4 | 1.8 | 1.9 | 1.5 | 1.8 | 1.7 | 1.9 | 1.2 |
| continuous | stain on mold | ○ | ○ | ○ | ○ | ○ | ○ | ○ | ○ | ○ | ○ |
| moldability | stain on product | ○ | ○ | ○ | ○ | ○ | ○ | ○ | ○ | ○ | ○ |
| Spiral flow (cm) | | 120 | 98 | 100 | 105 | 90 | 90 | 94 | 92 | 105 | 95 |
| Shore D hardness | | 80 | 85 | 85 | 84 | 84 | 84 | 84 | 85 | 85 | 84 |
| Adhesiveness at high temperature (shear adhesivenss N/mm2) | | 10.5 | 10.6 | 10.7 | 11.7 | 12.0 | 9.8 | 11.9 | 11.2 | 12.9 | 9.1 |
| Solder resistance (delaminated ratio %) | | 5 | 5 | 0 | 0 | 0 | 0 | 0 | 0 | 0 | 0 |

TABLE 2

| | | Comparative Examples | | | | | | | | |
|---|---|---|---|---|---|---|---|---|---|---|
| | | 1 | 2 | 3 | 4 | 5 | 6 | 7 | 8 | 9 |
| Formulation | | | | | | | | | | |
| Epoxy resin rep. by formula (2) | | | 8.16 | 8.16 | 8.16 | 8.16 | 8.16 | 8.16 | 8.16 | 8.16 |
| Phenolic resin rep. by formula (3) | | | 6.04 | 6.04 | 6.04 | 6.04 | 6.04 | 6.04 | 6.04 | 6.04 |
| Epoxy resin rep. d by formula (4) | | 7.43 | | | | | | | | |
| Phenolic resin rep. by formula (5) | | 6.77 | | | | | | | | |
| DBU | | 0.20 | 0.20 | 0.20 | 0.20 | 0.20 | 0.20 | 0.20 | 0.20 | 0.20 |
| Spherical fused silica | | 85.20 | 85.20 | 85.20 | 85.20 | 85.20 | 85.20 | 85.20 | 85.20 | 85.20 |
| Carbon black | | 0.30 | 0.30 | 0.30 | 0.30 | 0.30 | 0.30 | 0.30 | 0.30 | 0.30 |
| Release agent (I) | | 0.10 | | | | | | | | |
| Release agent (VII) | | | 0.10 | | | | | | | |
| Release agent (VIII) | | | | 0.10 | | | | | | |
| Release agent (IX) | | | | | 0.10 | | | | | |
| Release agent (X) | | | | | | 0.10 | | | | |
| Release agent (XI) | | | | | | | 0.10 | | | |
| Release agent (XII) | | | | | | | | 0.10 | | |
| Release agent (XIII) | | | | | | | | | 0.10 | |
| Release agent (XIV) | | | | | | | | | | 0.10 |
| result | | | | | | | | | | |
| Releasing force (N) | 1st shot | 2.0 | 3.8 | 1.4 | 1.6 | 3.6 | 3.5 | 1.5 | 3.6 | 1.2 |
| | 10th shot | 1.8 | 3.3 | 1.2 | 1.5 | 3.3 | 3.3 | 1.3 | 3.4 | 0.9 |
| | 50th shot | 1.7 | 3.0 | 1.1 | 1.3 | 3.0 | 3.0 | 1.2 | 3.2 | 0.9 |
| | 100th shot | 1.6 | 2.8 | 1.0 | 1.2 | 3.0 | 2.9 | 1.1 | 3.1 | 0.8 |
| continuous | stain on mold | ○ | ○ | X | X | ○ | ○ | X | ○ | X |
| moldability | stain on product | ○ | ○ | X | X | ○ | ○ | X | ○ | X |
| Spiral flow (cm) | | 130 | 105 | 90 | 85 | 95 | 100 | 80 | 95 | 90 |
| Shore D hardness | | 81 | 84 | 84 | 84 | 84 | 84 | 84 | 84 | 84 |
| Adhesiveness at high temperature (shear adhesivenss N/mm2) | | 9.8 | 9.2 | 7.5 | 7.8 | 8.4 | 9.1 | 7.4 | 9.9 | 7.1 |
| Solder resistance (delaminated ratio %) | | 30 | 40 | 60 | 50 | 20 | 30 | 50 | 10 | 80 |

The epoxy resin composition according to the present invention has better mold releasability, lower moisture absorption and lower stress generation, and thus provides improved mold releasability and continuous moldability when the composition is employed to mold and package the semiconductor element. Further, the epoxy resin composition provides improved adhesiveness with the metal member such as lead frame or the like, thereby being capable of obtaining the semiconductor device having improved solder resistance.

What is claimed is:

1. An epoxy resin composition for packaging a semiconductor element, obtained by formulating:

(A) phenol aralkyl type of epoxy resin having a biphenylene unit in the main chain;

(B) a phenolic resin;
(C) a curing accelerator;
(D) an inorganic filler; and
(E) an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

2. The epoxy resin composition for packaging a semiconductor element, according to claim 1,
wherein the said (A) epoxy resin has a structure represented by general formula (1a):

(1a)

wherein R may be same or different, and represents a hydrogen atom or functional group selected from alkyl groups having 1 carbon to 4 carbons; X represents glycidyl ether group; and n represents a positive number more than or equal to 1.

3. The epoxy resin composition for packaging a semiconductor element, according to claim 1,
wherein the said (B) phenolic resin has a structure represented by general formula (1b):

(1b)

wherein R may be same or different, and represents a hydrogen atom or functional group selected from alkyl groups having 1 carbon to 4 carbons; X represents hydroxyl group; and n represents a positive number more than or equal to 1.

4. The epoxy resin composition for packaging a semiconductor element, according to claim 1,
wherein content of said (E) oxidized polyethylene wax in said epoxy resin composition is within a range of from 0.01 to 1% wt.

5. A semiconductor device, which is formed by employing said epoxy resin composition according to claim 1 to package a semiconductor element included therein.

6. An epoxy resin composition for packaging a semiconductor element, obtained by formulating:
(A) an epoxy resin;
(B) a phenol aralkyl type of phenolic resin having a biphenylene unit in the main chain;
(C) a curing accelerator;
(D) an inorganic filler; and
(E) an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

7. The epoxy resin composition for packaging a semiconductor element, according to claim 6,
wherein the said (A) epoxy is a phenol aralkyl type of epoxy resin having a biphenylene unit in the main chain.

8. The epoxy resin composition for packaging a semiconductor element, according to claim 6,
wherein the said (A) epoxy resin has a structure represented by general formula (1a):

(1a)

wherein R may be same or different, and represents a hydrogen atom or functional group selected from alkyl groups having 1 carbon to 4 carbons; X represents glycidyl ether group; and n represents a positive number more than or equal to 1.

9. The epoxy resin composition for packaging a semiconductor element, according to claim 6,
wherein the said (B) phenolic resin has a structure represented by general formula (1b):

(1b)

wherein R may be same or different, and represents a hydrogen atom or functional group selected from alkyl groups having 1 carbon to 4 carbons; X represents hydroxyl group; and n represents a positive number more than or equal to 1.

10. The epoxy resin composition for packaging a semiconductor element, according to claim 6,
wherein content of said (E) oxidized polyethylene wax in said epoxy resin composition is within a range of from 0.01 to 1% wt.

11. A semiconductor device, which is formed by employing said epoxy resin composition according to claim 6 to package a semiconductor element included therein.

12. A moldable epoxy resin composition for packaging a semiconductor element, comprising:
phenol aralkyl type of epoxy resin having a biphenylene unit in the main chain;
a phenolic resin;
an inorganic filler; and an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

13. The moldable epoxy resin composition for packaging a semiconductor element, according to claim 12,
wherein the said epoxy resin has a structure represented by general formula (1a):

wherein, R may be same or different, and represents a hydrogen atom or functional group selected from alkyl groups having 1 carbon to 4 carbons; X represents glycidyl ether group; and n represents a positive number more than or equal to 1.

14. The moldable epoxy resin composition for packaging a semiconductor element, according to claim 12,
wherein the said phenolic resin has a structure represented by general formula (1b):

wherein, R may be same or different, and represents a hydrogen atom or functional group selected from alkyl groups having 1 carbon to 4 carbons; X represents hydroxyl group; and n represents a positive number more than or equal to 1.

15. The moldable epoxy resin composition for packaging a semiconductor element, according to claim 12,
wherein the content of said oxidized polyethylene wax in said epoxy resin composition is within a range of from 0.01 to 1% wt.

16. A composition for encapsulating a semiconductor device, comprising:
(1) the moldable epoxy resin composition according to claim 12, and
(2) a curing accelerator.

17. A moldable epoxy resin composition for packaging a semiconductor element, comprising:
an epoxy resin;
a phenol aralkyl type of phenolic resin having a biphenylene unit in the main chain;
an inorganic filler; and
an oxidized polyethylene wax having a drop point within a range of from 60 to 140 degree C., an acid value within a range of from 10 to 100 (mg KOH/g), a number average molecular weight within a range of from 500 to 20,000, and a mean particle size within a range of from 5 to 100 μm.

18. The moldable epoxy resin composition for packaging a semiconductor element, according to claim 17,
wherein the said epoxy resin has a structure represented by general formula (1a):

wherein, R may be same or different, and represents a hydrogen atom or functional group selected from alkyl groups having 1 carbon to 4 carbons; X represents glycidyl ether group; and n represents a positive number more than or equal to 1.

19. The moldable epoxy resin composition for packaging a semiconductor element, according to claim 17,
wherein the said phenolic resin has a structure represented by general formula (1b):

wherein, R may be same or different, and represents a hydrogen atom or functional group selected from alkyl groups having 1 carbon to 4 carbons; X represents hydroxyl group; and n represents a positive number more than or equal to 1.

20. The moldable epoxy resin composition for packaging a semiconductor element, according to claim 17,
wherein the content of said oxidized polyethylene wax in said epoxy resin composition is within a range of from 0.01 to 1% wt.

21. A composition for encapsulating a semiconductor device, comprising:
(1) the moldable epoxy resin composition according to claim 17, and
(2) a curing accelerator.

* * * * *